United States Patent
Cox et al.

(10) Patent No.: US 10,176,973 B2
(45) Date of Patent: Jan. 8, 2019

(54) METHOD OF COOLING A COMPOSITION USING A HALL EFFECT ENHANCED CAPACITIVELY COUPLED PLASMA SOURCE, AN ABATEMENT SYSTEM, AND VACUUM PROCESSING SYSTEM

(71) Applicant: Applied Materials, Inc., Santa Clara, CA (US)

(72) Inventors: Michael S. Cox, Gilroy, CA (US); Rongping Wang, Cupertino, CA (US); Brian T. West, San Jose, CA (US); Roger M. Johnson, Livermore, CA (US); Colin John Dickinson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/411,711

(22) Filed: Jan. 20, 2017

(65) Prior Publication Data
US 2017/0133208 A1  May 11, 2017

Related U.S. Application Data

(63) Continuation of application No. 14/995,187, filed on Jan. 13, 2016, now Pat. No. 9,552,967, which is a
(Continued)

(51) Int. Cl.
*B01D 53/64* (2006.01)
*B01D 53/68* (2006.01)
(Continued)

(52) U.S. Cl.
CPC ...... *H01J 37/32844* (2013.01); *B01D 53/323* (2013.01); *H01J 37/32082* (2013.01);
(Continued)

(58) Field of Classification Search
CPC ................ H01J 37/3266; H01J 37/165; H01J 37/32091; H01J 37/32541;
(Continued)

(56) References Cited

U.S. PATENT DOCUMENTS

| 5,453,125 A | 9/1995 | Krogh |
| 6,156,667 A | 12/2000 | Jewett |

(Continued)

FOREIGN PATENT DOCUMENTS

| CN | 1816383 A | 8/2006 |
| CN | 102568635 A | 7/2012 |

OTHER PUBLICATIONS

U.S. Appl. No. 62/007,513 in the name of Colin John Dickinson entitled Reagent Delivery System Freeze Prevention Heat Exchanger; filed Jun. 4, 2014; 18 total pages.
(Continued)

*Primary Examiner* — Tracie Y Green
(74) *Attorney, Agent, or Firm* — Patterson + Sheridan LLP

(57) ABSTRACT

Embodiments disclosed herein include a method for abating compounds produced in semiconductor processes. The method includes energizing an abating agent, forming a composition by reacting the energized abating agent with gases exiting a vacuum processing chamber, and flowing the composition through a plurality of holes formed in a cooling plate. By cooling the composition with the cooling plate, damages on the downstream pump are avoided.

12 Claims, 7 Drawing Sheets

Related U.S. Application Data continuation of application No. 14/498,920, filed on Sep. 26, 2014, now Pat. No. 9,240,308, which is a continuation-in-part of application No. 14/199,974, filed on Mar. 6, 2014, now Pat. No. 9,230,780.

(60) Provisional application No. 62/050,555, filed on Sep. 15, 2014.

(51) Int. Cl.
  *H01J 37/32* (2006.01)
  *B01D 53/32* (2006.01)
  *H01L 21/02* (2006.01)

(52) U.S. Cl.
  CPC .. *H01J 37/32357* (2013.01); *H01J 37/32495* (2013.01); *H01J 37/32541* (2013.01); *H01J 37/32568* (2013.01); *H01J 37/32596* (2013.01); *H01J 37/32669* (2013.01); *H01J 37/32825* (2013.01); *H01L 21/02123* (2013.01); *H01L 21/02274* (2013.01); *B01D 2257/55* (2013.01); *B01D 2257/553* (2013.01); *B01D 2257/556* (2013.01); *B01D 2258/0216* (2013.01); *H01J 2237/332* (2013.01); *H01J 2237/334* (2013.01); *H01J 2237/335* (2013.01); *Y02C 20/30* (2013.01)

(58) Field of Classification Search
  CPC .......... H01J 37/32568; H01J 37/32651; H01J 37/32699; H01J 37/32844; H01J 2237/002; H01J 2237/327; Y02C 20/30
  See application file for complete search history.

(56) References Cited

U.S. PATENT DOCUMENTS

| | | |
|---|---|---|
| 6,291,938 B1 | 9/2001 | Jewett et al. |
| 6,740,853 B1 * | 5/2004 | Johnson .............. C23C 16/4586 118/620 |
| 6,815,674 B1 | 11/2004 | Voss |
| 6,888,040 B1 | 5/2005 | Shufflebotham et al. |
| 8,742,665 B2 | 6/2014 | Lubomirsky et al. |
| 8,747,762 B2 | 6/2014 | Dickinson et al. |
| 8,771,538 B2 | 7/2014 | Lubomirsky et al. |
| 9,230,780 B2 | 1/2016 | Cox et al. |
| 9,240,308 B2 | 1/2016 | Cox et al. |
| 9,333,460 B2 * | 5/2016 | Radoiu .................. B01D 53/32 |
| 2009/0183684 A1 | 7/2009 | Radoiu |
| 2009/0191109 A1 * | 7/2009 | Tsuda ..................... C23C 16/34 423/240 R |
| 2010/0230053 A1 * | 9/2010 | Nishio .............. H01J 37/32091 156/345.49 |
| 2011/0204023 A1 | 8/2011 | Huh et al. |
| 2012/0025710 A1 | 2/2012 | Klyuev et al. |
| 2012/0261587 A1 | 10/2012 | Kellogg et al. |
| 2012/0279657 A1 | 11/2012 | Srivastava et al. |
| 2013/0082197 A1 | 4/2013 | Yang et al. |
| 2013/0284724 A1 | 10/2013 | Cox et al. |
| 2014/0262033 A1 | 9/2014 | Herbert et al. |
| 2014/0291139 A1 | 10/2014 | Dickinson et al. |
| 2014/0312761 A1 * | 10/2014 | Tamagaki ........... C23C 14/3407 313/34 |
| 2015/0187625 A1 * | 7/2015 | Busche .............. H05K 7/20218 361/234 |

OTHER PUBLICATIONS

U.S. Appl. No. 14/445,965 in the name of Jibing Zeng, et al.; entitled Apparatus for Treating a Gas in a Conduit; filed Jul. 29, 2014; 18 total pages.

PCT Notification of Transmittal of the International Search Report and the Written Opinion of the International Searching Authority for International Application No. PCT/US2015/015054 dated May 15, 2015; 9 total pages.

Chinese Office Action (with attached English translation) for Application No. 201580012315,0; dated Oct. 8, 2018; 15 total pages.

* cited by examiner

METHOD OF COOLING A COMPOSITION USING A HALL EFFECT ENHANCED CAPACITIVELY COUPLED PLASMA SOURCE, AN ABATEMENT SYSTEM, AND VACUUM PROCESSING SYSTEM

CROSS-REFERENCE TO RELATED APPLICATIONS

This application is a continuation application of U.S. patent application Ser. No. 14/995,187, filed on Jan. 13, 2016, which claims the benefit of U.S. patent application Ser. No. 14/498,920, filed on Sep. 26, 2014, which claims the benefit of U.S. Provisional Application Ser. No. 62/050,555, filed Sep. 15, 2014, co-pending U.S. patent application Ser. No. 14/498,920 is also a continuation-in-part of U.S. patent application Ser. No. 14/199,974, filed Mar. 6, 2014, now U.S. Pat. No. 9,230,780, issued on Jan. 5, 2016. All of said applications are incorporated herein by reference.

BACKGROUND

Field

Embodiments of the present disclosure generally relate to semiconductor processing equipment. More particularly, embodiments of the present disclosure relate to a plasma source, an abatement system, and vacuum processing system for abating compounds produced in semiconductor processes.

Description of the Related Art

The process gases used by semiconductor processing facilities include many compounds which must be abated or treated before disposal, due to regulatory requirements and environmental and safety concerns. Typically, a remote plasma source may be coupled to a processing chamber to abate the compounds coming out of the processing chamber. Halogen-containing plasma and gases are frequently used in etch or cleaning processes, and components of the processing chamber and the remote plasma source are susceptible to erosion from the halogen-containing plasma and gases. The erosion reduces the usable life of the processing chamber components and the remote plasma source, and, additionally, introduces undesirable defects and contamination into the processing environment.

Accordingly, what is needed in the art is an improved plasma source, and abatement system for abating compounds produced in semiconductor processes.

SUMMARY

Embodiments disclosed herein include a plasma source, an abatement system and a vacuum processing system for abating compounds produced in semiconductor processes. In one embodiment, a plasma source is disclosed. The plasma source includes a first plate having an outer edge and an inner edge, a second plate parallel to the first plate, where the second plate has an outer edge and an inner edge, an outer wall disposed between the outer edges of the first and second plates, an electrode disposed between the inner edges of the first and second plates, a first plurality of magnets disposed on the first plate and a second plurality of magnets disposed on the second plate.

In another embodiment, an abatement system is disclosed. The abatement system includes a plasma source that includes a body having a first end and a second end, and the first end is configured to couple to a foreline and the second end is configured to couple to a conduit. The plasma source further includes an electrode disposed in the body, a first plurality of magnets disposed on a first plate of the body, and a second plurality of magnets disposed on a second plate of the body.

In another embodiment, a vacuum processing system is disclosed. The vacuum processing system includes a vacuum processing chamber, and a plasma source that includes a first plate having an outer edge and an inner edge, a second plate parallel to the first plate, where the second plate has an outer edge and an inner edge, an outer wall disposed between the outer edges of the first and second plates, an electrode disposed between the inner edges of the first and second plates, a first plurality of magnets disposed on the first plate and a second plurality of magnets disposed on the second plate.

In another embodiment, a method for cooling a composition includes energizing an abating agent, forming a composition by reacting the energized abating agent with gases exiting a vacuum processing chamber, and flowing the composition through a plurality of holes formed in a cooling plate.

In another embodiment, a method for cooling a composition includes energizing an abating agent, forming a composition by reacting the energized abating agent with gases exiting a vacuum processing chamber, and flowing the composition through a cooling plate in an exhaust cooling apparatus.

In another embodiment, a method for cooling a composition includes energizing an abating agent, forming a composition by reacting the energized abating agent with gases exiting a vacuum processing chamber, and flowing the composition into an exhaust cooling apparatus, wherein the exhaust cooling apparatus includes a first end, a second end, wherein a cavity is formed between the first end and the second end, and a cooling plate disposed in the cavity.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
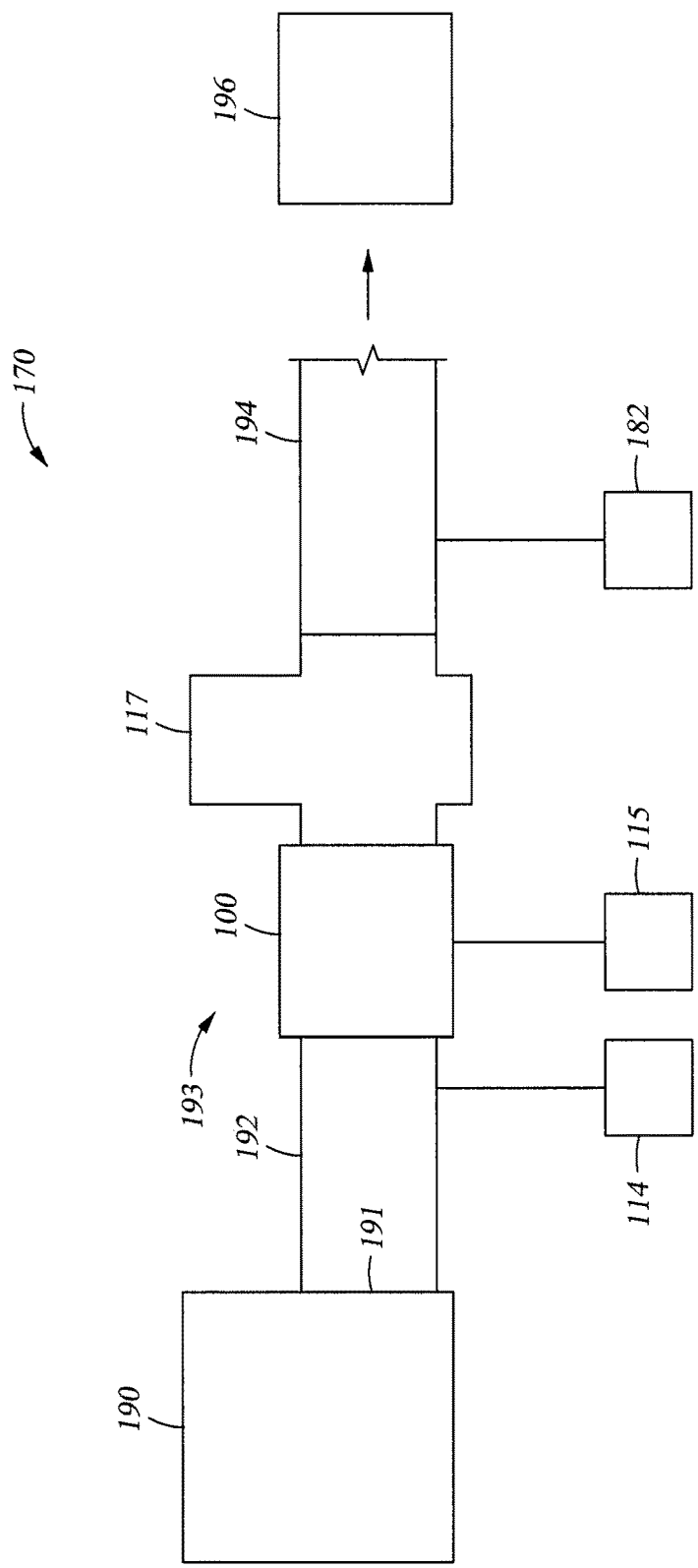
FIG. 1A is a schematic side view of a vacuum processing system having a plasma source.

FIG. 1A is a schematic side view of a vacuum processing system 170 having a plasma source 100 utilized in an abatement system 193. The vacuum processing system 170 includes at least a vacuum processing chamber 190 and the plasma source 100. The abatement system 193 includes at least the plasma source 100. The vacuum processing chamber 190 is generally configured to perform at least one integrated circuit manufacturing process, such as a deposition process, an etch process, a plasma treatment process, a preclean process, an ion implant process, or other integrated circuit manufacturing process. The process performed in the vacuum processing chamber 190 may be plasma assisted. For example, the process performed in the vacuum processing chamber 190 may be plasma deposition process for depositing a silicon-based material.

The vacuum processing chamber 190 has a chamber exhaust port 191 coupled to the plasma source 100 of the abatement system 193 via a foreline 192. An exhaust of the plasma source 100 is coupled by an exhaust conduit 194 to pumps and facility exhaust, schematically indicated by a single reference numeral 196 in FIG. 1A. The pumps are generally utilized to evacuate the vacuum processing chamber 190, while the facility exhaust generally includes scrubbers or other exhaust cleaning apparatus for preparing the effluent of the vacuum processing chamber 190 to enter the atmosphere.

The plasma source 100 is utilized to perform an abatement process on gases and/or other materials exiting the vacuum processing chamber 190 so that such gases and/or other materials may be converted into a more environmentally and/or process equipment friendly composition. Details of the plasma source 100 are further described below.

In some embodiment, an abating agent source 114 is coupled to the foreline 192 and/or the plasma source 100. The abating agent source 114 provides an abating agent into the plasma source 100 which may be energized to react with or otherwise assist converting the materials exiting the vacuum processing chamber 190 into a more environmentally and/or process equipment friendly composition. Optionally, a purge gas source 115 may be coupled to the plasma source 100 for reducing deposition on components inside the plasma source 100.

An exhaust cooling apparatus 117 may be coupled between the plasma source 100 and the exhaust conduit 194 for reducing the temperature of the exhaust coming out of the plasma source 100. In one example, the exhaust cooling apparatus 117 is a part of the abatement system 193.

Optionally, a pressure regulating module 182 may be coupled to at least one of the plasma source 100 or exhaust conduit 194. The pressure regulating module 182 injects a pressure regulating gas, such as Ar, N, or other suitable gas which allows the pressure within the plasma source 100 to be better controlled, and thereby provide more efficient abatement performance. In one example, the pressure regulating module 182 is a part of the abatement system 193.

Figure 1B:
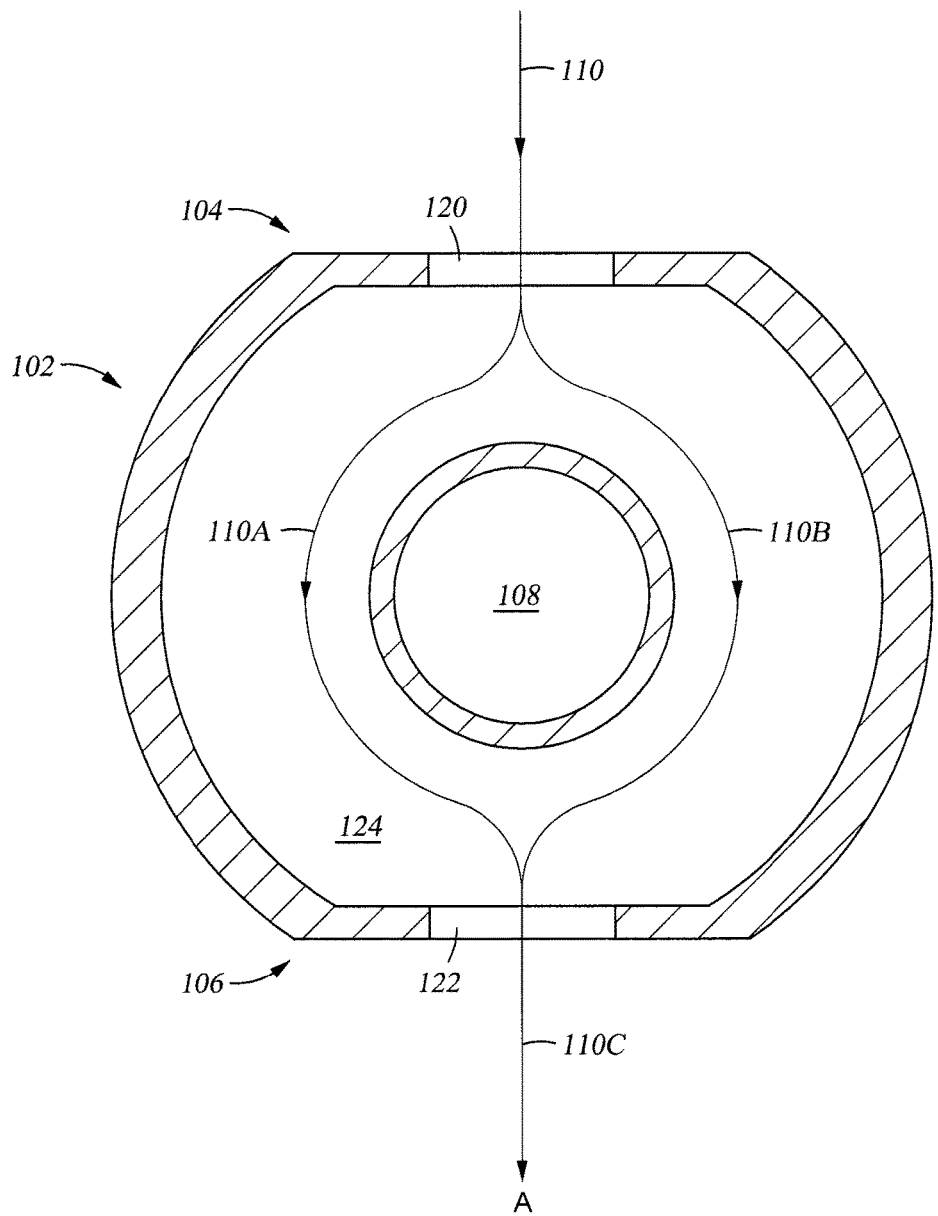
FIG. 1B is a sectional view of the plasma source of FIG. 1A.

FIG. 1B is a side view of the plasma source 100 according to one embodiment. The plasma source 100 may be disposed downstream of the vacuum processing chamber 190. The plasma generated in the plasma source 100 energizes and/or dissociates, partially or fully, the compounds within the effluent coming out of the vacuum processing chamber 190, converting the compounds in the effluent into more benign form. In one embodiment, due to the ability of producing dense plasma, the plasma source 100 may act as a remote plasma source that is disposed upstream of the processing chamber to deliver products of plasma, such as molecular or atomic species, a dense plasma into the processing chamber.

The plasma source 100 may include a body 102 having a first end 104 and a second end 106. The first end 104 may be parallel to the second end 106. The first end 104 may have an opening 120 configured to couple to the foreline 192 with or without a flange and the second end 106 may have an opening 122 configured to coupled to the exhaust cooling apparatus 117 with or without a flange. Flanges are shown and described further below with reference to FIG. 3. The body 102 may be circular, square, rectangular, or in other suitable shape. In one embodiment, the body 102 has a toroidal shape. An opening 108 may be formed through the body 102. The opening 108 may be circular, square, rectangular, or in other suitable shape. In one embodiment, the body 102 is annular. In other embodiments, the body 102 does not include the opening 108.

A gas mixture 110, such as the by-products in the effluent exiting the vacuum processing chamber 190 or in the example where the plasma source 100 is a remote plasma source, as precursor and/or carrier gases for generating a remote plasma, may enter the plasma source 100 through the opening 120 at the first end 104. The gas mixture 110 may be dissociated by a plasma formed in the plasma region 124 and treated by abating agents, and exiting as a less hazardous material through the opening 122 at the second end 106. The gas mixture 110 may split into two streams 110A and 110B by the opening 108 and then combine to stream 110C when exiting the body 102, indicated by path "A" shown in FIG. 1B. If the gas mixture 110 is the by-products in the effluent exiting the vacuum processing chamber, one or more abating agents may be introduced into the plasma source 100 from the abating agent source 114 shown in FIG. 1A. The by-products in the effluent may include silicon, tungsten, titanium, or aluminum containing materials. Examples of silicon-containing materials present in the effluent that may be abated using the plasma source 100 disclosed herein include, for example, silicon oxide (SiO), silicon dioxide ($SiO_2$), silane ($SiH_4$), disilane, silicon tetrachloride ($SiCl_4$), silicon nitride ($SiN_x$), dichlorosilane ($SiH_2Cl_2$), hexachlorodisilane ($Si_2Cl_6$), bis(t-butyl amino)silane, trisilylamine, disilylmethane, trisilylmethane, tetrasilylmethane, tetraethyl orthosilicate (TEOS) ($Si(OEt)_4$), disiloxanes, such as disiloxane ($SiH_3OSiH_3$), trisiloxane ($SiH_3OSiH_2OSiH_3$), tetrasiloxane ($SiH_3OSiH_2OSiH_2OSiH_3$), and cyclotrisiloxane ($—SiH_2OSiH_2OSiH_2O—$). Examples of tungsten-containing materials present in the effluent that may be abated using the methods disclosed herein include, for example, $W(CO)_6$, $WF_6$, $WCl_6$, or $WBr_6$. Examples of titanium-containing materials present in the effluent that may be abated using the methods disclosed herein include, for example, $TiCl_4$ and $TiBr_4$. Examples of aluminum-containing materials present in the effluent that may be abated using the methods disclosed herein include, for example, trimethyl aluminum.

The abating agent may include, for example, $CH_4$, $H_2O$, $H_2$, $NF_3$, $SF_6$, $F_2$, HCl, HF, $Cl_2$, HBr, $O_2$, $N_2$, $O_3$, CO, $CO_2$, $NH_3$, $N_2O$, and combinations thereof. The abating agent may also include a combination of $CH_xF_y$ and $O_2$ and/or $H_2O$, and a combination of $CF_x$ and $O_2$ and/or $H_2O$. Different abating agent may be used for effluent having different compositions.

Figure 2A:
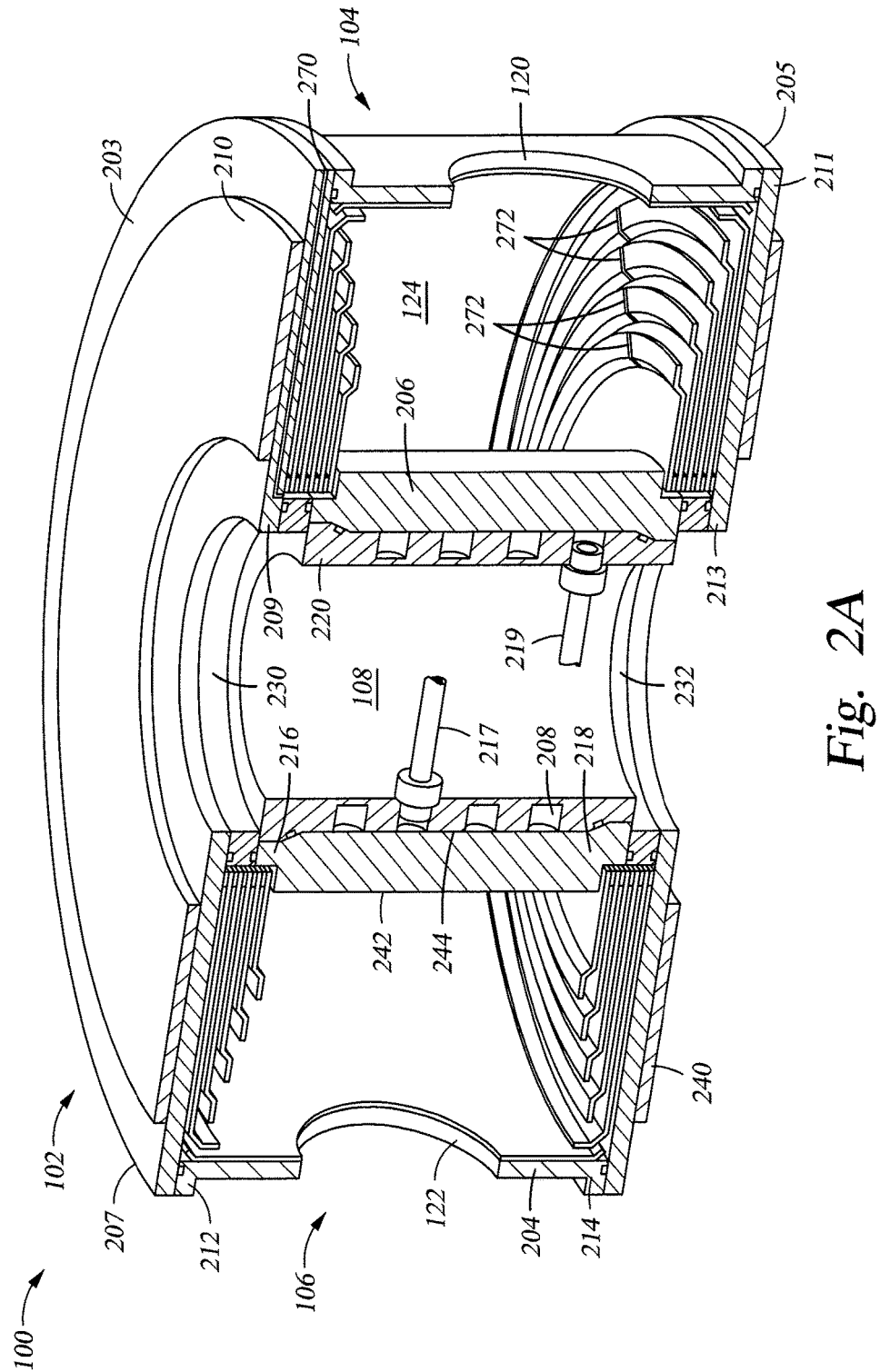
FIG. 2A is a cross sectional perspective view of the plasma source.

FIG. 2A is a cross sectional perspective view of the plasma source 100 according to one embodiment. As shown in FIG. 2A, the body 102 may include an outer wall 204, an inner wall 206, a first plate 203 and a second plate 205. The first plate 203 and the second plate 205 may have a ring shape and the outer and inner walls 204, 206 may be cylindrical. The inner wall 206 may be a hollow electrode which may be coupled to an RF source (not shown). The outer wall 204 may be grounded. The first plate 203 and the second plate 205 may be concentric with the inner wall 206. The first plate 203 may have an outer edge 207 and an inner edge 209 and the second plate 205 may have an outer edge 211 and an inner edge 213. The outer wall 204 may have a first end 212 and a second end 214, and the inner wall 206 may have a first end 216 and a second end 218. A first insulating ring 230 may be disposed adjacent to the first end 216 of the inner wall 206 and a second insulating ring 232 may be disposed adjacent to the second end 218 of the inner wall 206. The insulating rings 230, 232 may be made of an insulating ceramic material. The outer edge 207 of the first plate 203 may be adjacent to the first end 212 of the outer wall 204 and the outer edge 211 of the second plate 205 may be adjacent to the second end 214 of the outer wall 204. In one embodiment, the ends 212, 214 of the outer wall 204 are in contact with the outer edges 207, 211, respectively. The inner edge 209 of the first plate 203 may be adjacent to the first insulating ring 230 and the inner edge 213 of the second plate 205 may be adjacent to the second insulating ring 232. The plasma region 124 is defined between the outer wall 204 and the inner wall 206 and between the first plate 203 and the second plate 205, and a capacitively coupled plasma may be formed in the plasma region 124.

Figure 2B:
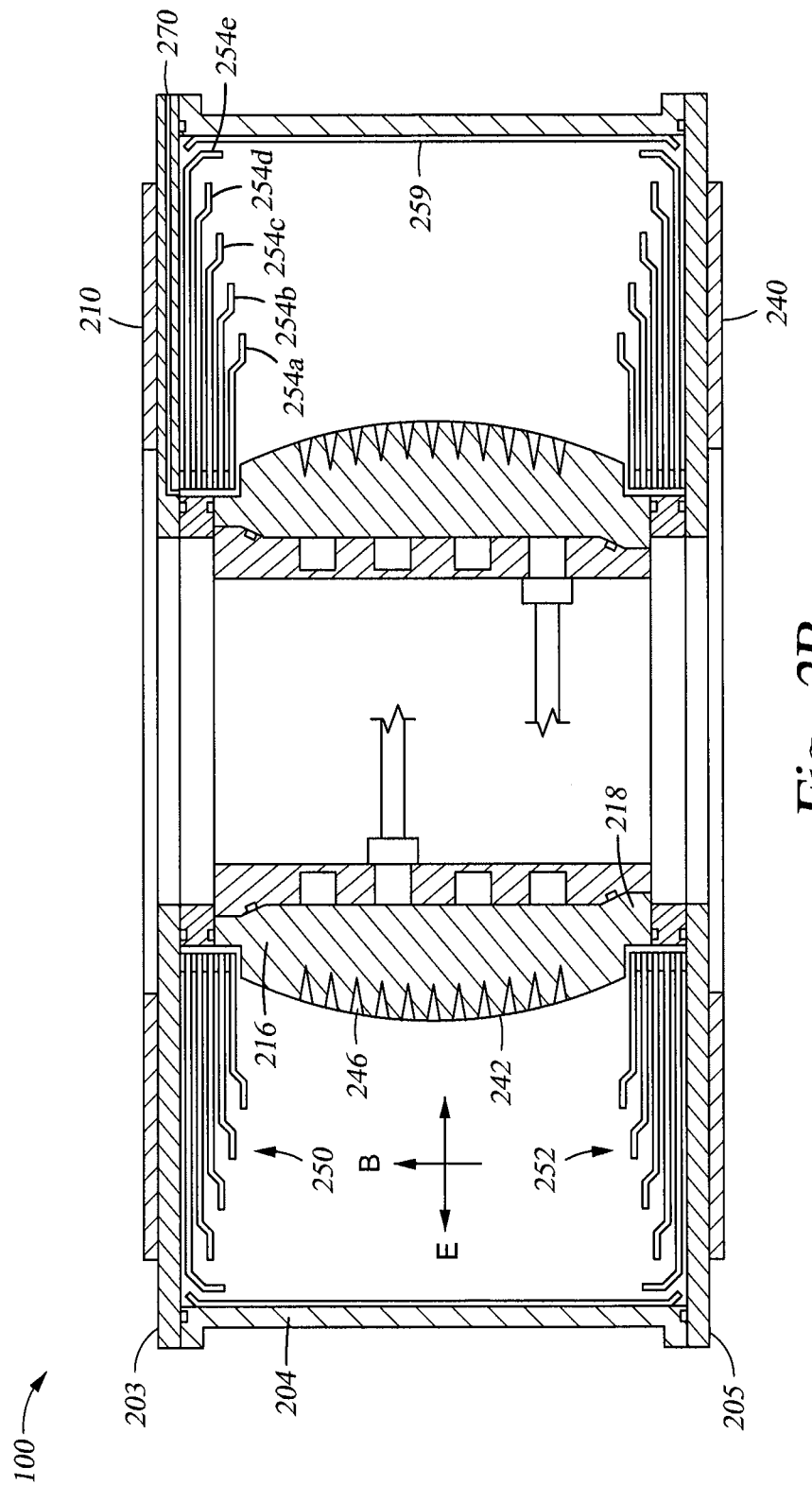
FIG. 2B is a cross sectional bottom view of the plasma source.

In order to keep the inner wall 206 cool during operation, a cooling jacket 220 may be coupled to the inner wall 206. The inner wall 206 may have a first surface 242 facing the outer wall 204 and a second surface 244 opposite the first surface. In one embodiment, both surfaces 242, 244 are linear and the cooling jacket 220 is coupled to the second surface 244. In one embodiment, the first surface 242 is curved and the second surface 244 is linear, as shown in FIG. 2B. The cooling jacket 220 may have a cooling channel 208 formed therein, and the cooling channel 208 is coupled to a coolant inlet 217 and a coolant outlet 219 for flowing a coolant, such as water, into and out of the cooling jacket 220. A first plurality of magnets 210 may be disposed on the first plate 203. In one embodiment, the first plurality of magnets 210 may be a magnetron having an array of magnets and may have an annular shape. A second plurality of magnets 240 may be disposed on the second plate 205, and the second plurality of magnets 240 may be a magnetron having an array of magnets and may have the same shape as the first plurality of magnets 210. In one embodiment, the second plurality of magnets 240 is a magnetron and has an annular shape. In one embodiment, the magnets 210, 240 are linear arrays formed near the ends 104, 106. The magnets 210, 240 may have opposite polarity facing the plasma region 124. The magnets 210, 240 may be rare-earth magnets, such as neodymium ceramic magnets. One or more gas injection ports 270 may be formed on the first plate 203 or first and second plates 203, 205, for injecting the abating agent and/or a purging gas. The purge gas may reduce deposition on shields 250, 252 (shown in FIG. 2B). The gas injection ports 270 may alternatively be formed in the foreline 192.

FIG. 2B is a cross sectional bottom view of the plasma source 100 according to one embodiment. As shown in FIG. 2B, the first surface 242 of the inner wall 206 has a plurality of groves 246 disposed thereon. The groves 246 may be a continuous trench. Even though the first surface 242 shown in FIG. 2B is curved, the groves 246 may be formed on the linear first surface 242, as shown in FIG. 2A. During operation, the inner wall 206 is powered by a radio frequency (RF) power source and the outer wall 204 is grounded, forming an oscillating or constant electric field "E" in the plasma region 124, depending on the type of applied power, RF or direct current (DC), or some frequency in between. Bi-polar DC and bi-polar pulsing DC power may also be used with inner and outer walls forming the two opposing electrical poles. The magnets 210, 240 create a largely uniform magnetic field "B" that is substantially perpendicular to the electric field "E." In this configuration, a resulting force causes the current that would normally follow the electric field "E" to curve towards the end 106 (out of the paper), and this force raises the plasma density significantly by limiting plasma electron losses to the grounded wall. In the case of applied RF power, this would result in an annular oscillating current directed largely away from the grounded wall. In the case of applied DC power, this would result in a constant annular current directed largely away from the grounded wall. This effect of current divergence from the applied electric field is known as the "Hall effect." The plasma formed in the plasma region 124 dissociates at least a portion of the by-products in the effluent flowing in from the opening 120 at the first end 104. Abating agent may be also injected to react with the dissociated and forming less hazardous compounds. In one embodiment, the effluent contains silane, and the abating agent may be water or oxygen, which turns silane in the effluent into glass.

Figure 2C:
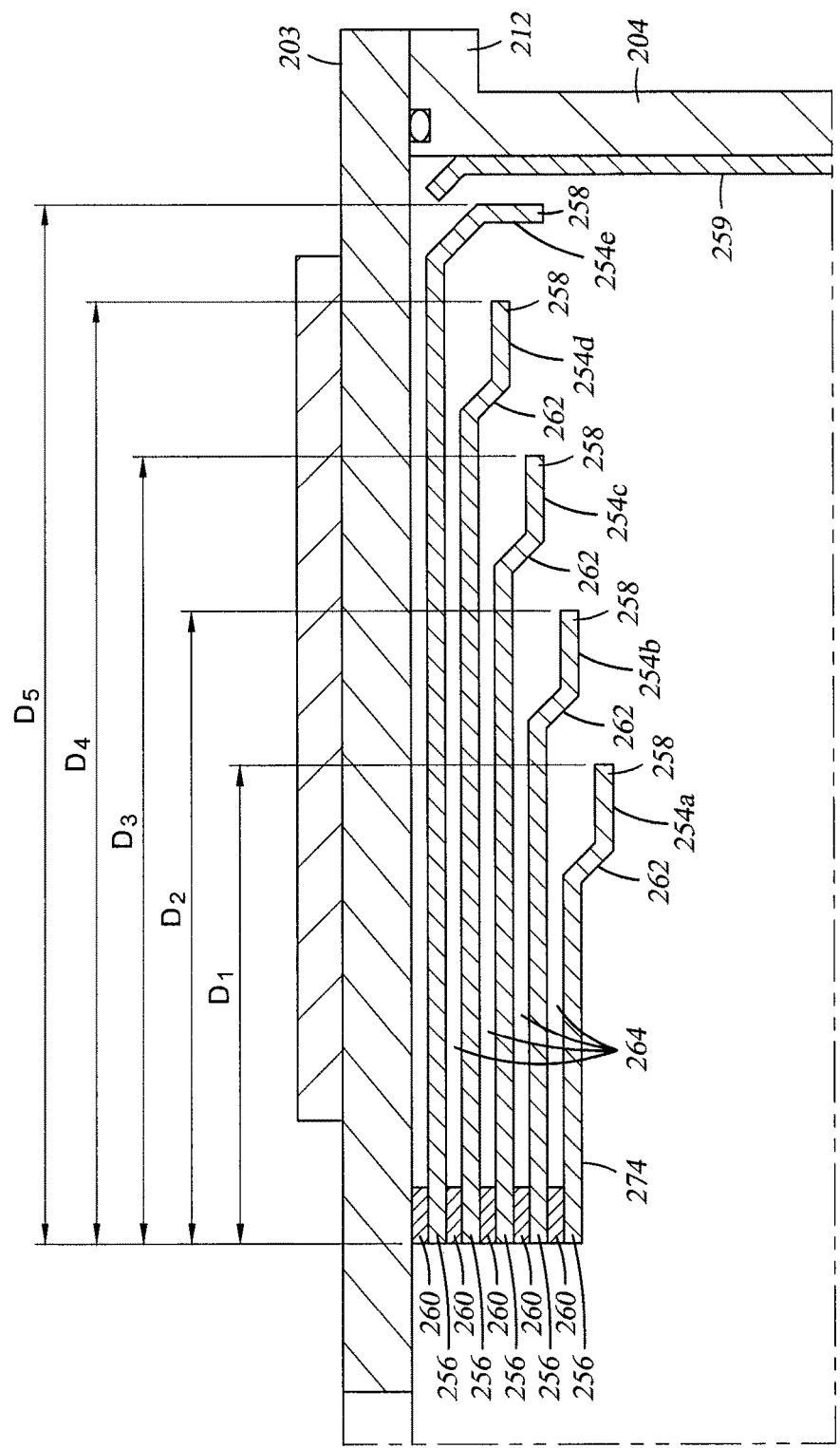
FIG. 2C is an enlarged view of a metal shield.

A first metal shield 250 may be disposed inside the plasma region 124 adjacent to the first plate 203, a second metal shield 252 may be disposed inside the plasma region 124 adjacent to the second plate 205, and a third metal shield 259 may be disposed in the plasma region adjacent to the outer wall 204. Shields 250, 252, 259 may be removable, replaceable and/or reusable since materials may be deposited thereon. The first metal shield 250 and the second metal shield 252 may have similar configuration. In one embodiment, both the first metal shield 250 and the second metal shield 252 have an annular shape. The first metal shield 250 and the second metal shield 252 each includes a stack of metal plates 254a-254e that are mutually isolated from one another. One or more gaps 272 (shown in FIG. 2A) may be formed in each metal plate 254a-254e for allowing expansion without deforming the metal plates 254a-254e. FIG. 2C is an enlarged view of the metal shield 250 according to one embodiment. For the purpose of clarity some components of the plasma source 100 are omitted, such as the one or more gas injection ports 270. Each plate 254a-254e may be annular and have an inner edge 256 and an outer edge 258. The metal plates 254a-254e may be coated to change shield surface emissivity. The coating may be an anodizing material to improve chemical resistance, radiant heat transfer, and stress reduction. In one embodiment, the metal plates 254a-254e are coated with black color aluminum oxide. An inner portion 274 of the metal plate 254a may be made of a ceramic material for arcing prevention and dimensional stability. The inner edges 256 of the plates 254a-254e are separated from one another by an insulating washer 260, so the plates 254a-254e are mutually isolated from one another. The washer 260 also separates the plate 254e from the first plate 203. The stack of metal plates 254a-254e may be secured by one or more ceramic rods or spacers (not shown). The one or more ceramic rods may go through the stack of metal plates 254a-254e and the washers, and one end of each rod is coupled to the inner wall 206 while the other end of each rod is coupled to the first/second plate 203, 205.

In one embodiment, the distance "D1" between the inner edge 256 and the outer edge 258 of the plate 254a is smaller than the distance "D2" between the inner edge 256 and the outer edge 258 of the plate 254b, which is smaller than the distance "D3" between the inner edge 256 and the outer edge 258 of the plate 254c, which is smaller than the distance "D4" between the inner edge 256 and the outer edge 258 of the plate 254d, which is smaller than the distance "D5" between the inner edge 256 and the outer edge 258 of the plate 254e. In other words, the distance between the inner edge 256 and the outer edge 258 is related to the location of the plate, i.e., the further the plate is disposed from the plasma region 124, the greater distance between the inner edge 256 and the outer edge 258. In this configuration, the electrical voltage between the inner wall 206 and the outer wall 204 is divided by six, since there are six gaps: between the inner wall 206 and the outer edge 258 of the plate 254a, between the outer edge 258 of the plate 254a and the outer edge 258 of the plate 254b, between the outer edge 258 of the plate 254b and the outer edge 258 of the plate 254c, between the outer edge 258 of the plate 254c and the outer edge 258 of the plate 254d, between the outer edge 258 of the plate 254d and the outer edge 258 of the plate 254e, and between the outer edge 258 of the plate 254e and the outer wall 204. Each gap has a small electric potential so the electric field across the gap is small, such the area cannot light up and take the applied power, thus forcing the power to go into the plasma region 124, creating a plasma in the plasma region 124. Without the shields 250, 252 as described above, there could be a localized plasma discharge between the first end 216 of the inner wall 206 and the first end 212 of the outer wall 204 and between the second end 218 of the inner wall 206 and the second end 214 of the outer wall 204, and the plasma region 124 may not be filled with plasma.

The spaces between the metal plates 254a-254e may be dark spaces, which may be bridged with materials deposited on the plates, causing the plates to be shorted out to each other. To prevent this from happening, in one embodiment, each metal plate 254a-254e includes a step 262 so the outer edge 258 of each metal plate 254a-254e is further away from the adjacent plate. The step 262 causes the outer edge 258 to be non-linear with the inner edge 256. Each step 262 shields the dark space 264 formed between adjacent metal plates, so no material may be deposited in the dark space 264.

The outer wall 204, the inner wall 206, and the shields 250, 252, 259 may be all made of metal since metal is resistant to most chemistries used in the semiconductor processes. The type of metal used may be depending on the chemistry used in the vacuum processing chamber upstream of the plasma source 100. In one embodiment, a chlorine based chemistry is used and the metal may be stainless steel, such as 316 stainless steel. The insulating rings 230, 232 in chlorine based chemistry may be made of quartz. In another embodiment, a fluorine based chemistry is used and the metal may be aluminum and the insulating rings 230, 232 may be made of alumina. The inner wall 206 may be made of anodized aluminum or spray coated aluminum.

In one example, the plasma source includes a cylindrical electrode having a first end and a second end, an outer cylindrical wall surrounding the cylindrical electrode, and the outer cylindrical wall has a first end and a second end. The plasma source further includes a first annular plate having an inner edge and an outer edge, and the inner edge is in proximity to the first end of the cylindrical electrode and the outer edge is adjacent to the first end of the outer cylindrical wall. The plasma source further includes a second annular plate having an inner edge and an outer edge, and the inner edge is in proximity to the second end of the cylindrical electrode and the outer edge is adjacent to the second end of the outer cylindrical wall. A plasma region is defined by the cylindrical electrode, the outer cylindrical wall, the first annular plate and the second annular plate. The plasma source further includes a first plurality of magnets disposed on the first annular plate and a second plurality of magnets disposed on the second annular plate.

In another example, the plasma source includes a first annular plate having an outer edge and an inner edge, a second annular plate parallel to the first annular plate, where the second annular plate has an outer edge and an inner edge, and wherein the first annular plate has a surface facing the second annular plate and the second annular plate has a surface facing the first annular plate. The plasma source further includes an outer cylindrical wall disposed between the outer edges of the first and second annular plates, an cylindrical electrode disposed between the inner edges of the first and second annular plates, a first shield disposed adjacent to the surface of the first annular plate, and a second shield disposed adjacent to the surface of the second annular plate.

Figure 3:
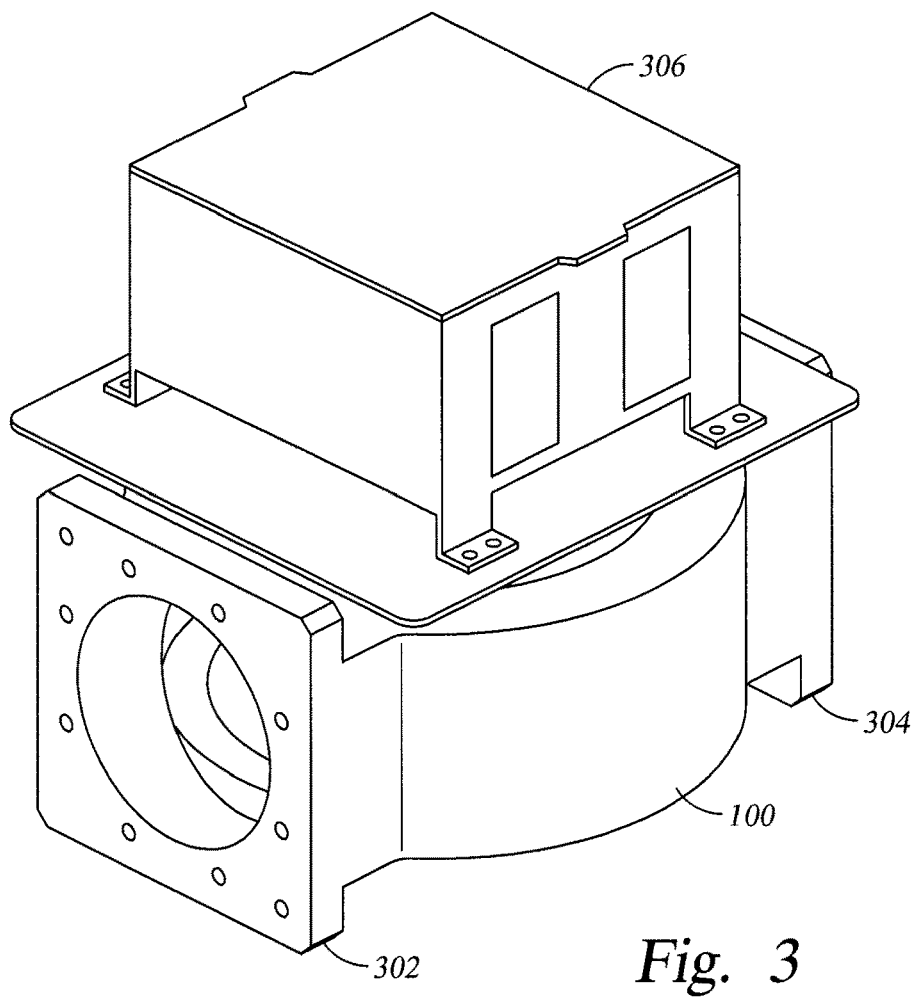
FIG. 3 is a perspective view of the plasma source.

FIG. 3 is a perspective view of the plasma source 100. An inlet flange 302 and an outlet flange 304 may be coupled to the first end 104 and the second end 106 of the plasma source 100, respectively. The inlet flange 302 may be coupled to the foreline 192 and the second flange 304 may be coupled to the exhaust cooling apparatus 117 as shown in FIG. 1A. The flanges 302, 304 may be coupled to the first end 104 and the second end 106 of the plasma source 100, respectively, by any suitable method. A box 306 may be disposed on the plasma source 100 for enclosing an RF match (not shown).

Figure 4:
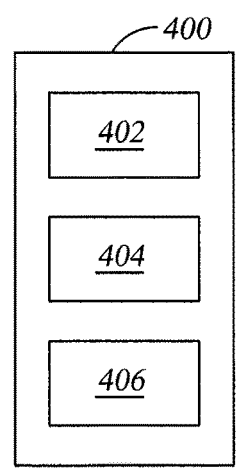
FIG. 4 schematically illustrate components associated with the plasma source.

FIG. 4 schematically illustrate components associated with the plasma source 100. A rack 400, or other container/support structure, may include an AC distribution box 402, an RF generator 404, and a controller 406. The AC distribution box 402 feeds power to the RF generator 404 and the controller 406. The RF generator 404 generates an RF power which may be supplied to the plasma source 100 via the RF match. The controller 406 communicates to semiconductor fabrication tool or semiconductor fabrication plant and controls the RF generator 404 and the process gases.

Figure 5:
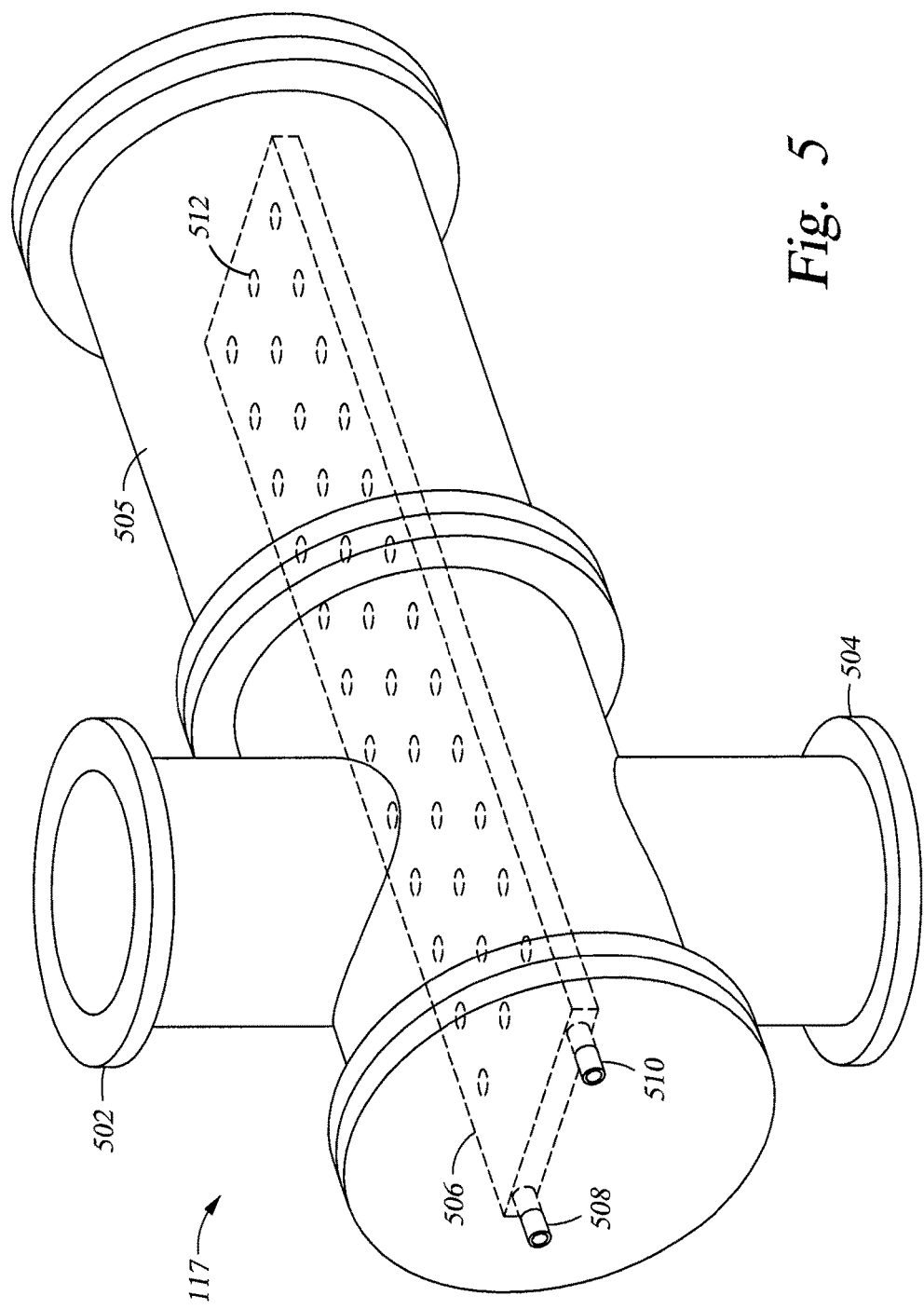
FIG. 5 is a perspective view of an exhaust cooling apparatus.

FIG. 5 is a perspective view of the exhaust cooling apparatus 117. The energized effluent in the plasma source 100 may recombine when existing the plasma source 100 via the second end 106, and the recombination reaction releases energy and causes the temperature of the effluent exiting the plasma source 100 to increase. The effluent having elevated temperature such as greater than 150 degrees Celsius may damage the pumps 196. In order to cool the effluent having elevated temperature, the exhaust cooling apparatus 117 may be coupled to the second end 106 of the plasma source 100. Alternatively, the exhaust cooling apparatus 117 may be coupled in the exhaust conduit 194 downstream of the plasma source 100 and upstream of the pressure regulating module 182. The exhaust cooling apparatus 117 may include a first end 502 for coupling to the flange 304 and a second end 504 for coupling to the exhaust conduit 194. A cavity 505 may be formed between the first end 502 and the second end 504, and a cooling plate 506 may be disposed in the cavity 505. The cooling plate 506 may include a cooling channel (not shown) formed therein, and a coolant inlet 508 and a coolant outlet 510 may be disposed on the cooling plate 506. A coolant, such as water, may be flowed from the coolant inlet 508 into the cooling channel and out of the coolant outlet 510. A plurality of holes 512 may be formed in the cooling plate for the hot effluent to pass through. The diameters of the holes 512 may be sufficiently large so there is minimum to no pressure build-up. In one embodiment, the holes 512 each has a diameter of about 0.5 inches and the pressure restriction is less than about 100 mTorr.

While the foregoing is directed to embodiments of the present disclosure, other and further embodiments may be devised without departing from the basic scope thereof, and the scope thereof is determined by the claims that follow.

What is claimed is:

1. A method for cooling a composition, comprising:
    energizing an abating agent in a plasma source by applying RF power to an electrode disposed in a body of the plasma source, wherein the plasma source is disposed downstream of a vacuum processing chamber;
    forming a composition by reacting the energized abating agent with gases exiting the vacuum processing chamber; and
    flowing the composition through an exhaust cooling apparatus, wherein the exhaust cooling apparatus comprises a first end, a second end, and a cooling plate disposed between the first end and the second end, wherein the cooling plate comprises a plurality of holes and a major surface substantially perpendicular to an axis extending from the first end to the second end.

2. The method of claim 1, wherein the abating agent is selected from the group consisting of $CH_4$, $H_2O$, $H_2$, $NF_3$, $SF_6$, $F_2$, HCl, HF, $Cl_2$, HBr, $O_2$, $N_2$, $O_3$, CO, $CO_2$, $NH_3$, $N_2O$, and combinations thereof.

3. The method of claim 1, wherein energizing the abating agent further comprises:
    forming a plasma.

4. The method of claim 1, wherein the plasma source is coupled to the exhaust cooling apparatus.

5. The method of claim 1, further comprising:
    flowing a coolant through the cooling plate.

6. The method of claim 5, wherein the coolant is water.

7. A method for cooling a composition, comprising:
    energizing an abating agent in a plasma source by applying RF power to an electrode disposed in a body of the plasma source, wherein the plasma source is disposed downstream of a vacuum processing chamber;
    forming a composition by reacting the energized abating agent with gases exiting the vacuum processing chamber; and
    flowing the composition into an exhaust cooling apparatus, wherein the exhaust cooling apparatus comprises:
        a first end;
        a second end, wherein a cavity is formed between the first end and the second end; and
        a cooling plate disposed in the cavity, wherein the cooling plate comprises a plurality of holes and a major surface substantially perpendicular to an axis extending from the first end to the second end, wherein the composition is flowed through the plurality of holes.

8. The method of claim 7, wherein the abating agent is selected from the group consisting of $CH_4$, $H_2O$, $H_2$, $NF_3$, $SF_6$, $F_2$, HCl, HF, $Cl_2$, HBr, $O_2$, $N_2$, $O_3$, CO, $CO_2$, $NH_3$, $N_2O$, and combinations thereof.

9. The method of claim 7, wherein energizing the abating agent comprises:
    forming a plasma from the abating agent.

10. The method of claim 7, wherein the plasma source is coupled to the exhaust cooling apparatus.

11. The method of claim 7 further comprising:
    flowing a coolant through the cooling plate.

12. The method of claim 11, wherein the coolant is water.

* * * * *